US010526705B2

(12) United States Patent
Boyd et al.

(10) Patent No.: US 10,526,705 B2
(45) Date of Patent: Jan. 7, 2020

(54) METHODS FOR CONTROLLING THE SUBSTRATE TEMPERATURE USING A PLURALITY OF FLUSHING GASES

(71) Applicant: AIXTRON SE, Herzogenrath (DE)

(72) Inventors: Adam Boyd, Kelmis (DE); Daniel Claessens, Aachen (DE); Hugo Silva, Aachen (DE)

(73) Assignee: AIXTRON SE, Herzogenrath (DE)

( * ) Notice: Subject to any disclaimer, the term of this patent is extended or adjusted under 35 U.S.C. 154(b) by 7 days.

(21) Appl. No.: 15/944,677

(22) Filed: Apr. 3, 2018

(65) Prior Publication Data
US 2018/0223425 A1 Aug. 9, 2018

Related U.S. Application Data

(62) Division of application No. 14/356,104, filed as application No. PCT/EP2012/071687 on Nov. 2, 2012.

(30) Foreign Application Priority Data

Nov. 4, 2011 (DE) .......................... 10 2011 055 061

(51) Int. Cl.
*C23C 16/46* (2006.01)
*C23C 16/458* (2006.01)
(Continued)

(52) U.S. Cl.
CPC .......... *C23C 16/458* (2013.01); *C23C 16/455* (2013.01); *C23C 16/46* (2013.01);
(Continued)

(58) Field of Classification Search
CPC ..... C23C 16/458; C23C 16/46; C23C 16/455; H01L 21/68771; H01L 21/67109; H01L 21/6875; H01L 21/68735
See application file for complete search history.

(56) References Cited

U.S. PATENT DOCUMENTS 3,892,940 A    7/1975   Bloem et al.
5,855,680 A * 1/1999   Soininen ............... C23C 16/448
                                                                                                         118/719
(Continued)

FOREIGN PATENT DOCUMENTS

DE    102006018514 A1    10/2007
EP        0160220 B2    8/1992
(Continued)

OTHER PUBLICATIONS

Muhsin, Ali, et al., "Design of Reliable and Low Cost Substrate Heater for Thin Film Deposition". World Academy of Science, Engineering and Technology, International Journal of Mechanical and Mechatronics Engineering, vol. 6, No. 8, 2012, pp. 1-6.*

(Continued)

*Primary Examiner* — Bret P Chen
(74) *Attorney, Agent, or Firm* — Ascenda Law Group, PC

(57) ABSTRACT

In a CVD reactor, flushing gases of different heat conductivities are used to flush a gap between a substrate holder and a heating system. The lower side of the substrate holder is configured differently in a central region with respect to the heat transmission from the heating system to the substrate holder, than in a circumferential region that surrounds the central region. The gap has such a gap height that, upon a change of a first flushing gas with a first heat conductivity to a second flushing gas with a second heat conductivity, the heat supplied from the heating system to the substrate holder changes differently in the circumferential region than in the central region.

3 Claims, 5 Drawing Sheets

(51) Int. Cl.
*H01L 21/687* (2006.01)
*H01L 21/67* (2006.01)
*C23C 16/455* (2006.01)

(52) U.S. Cl.
CPC .... *H01L 21/67109* (2013.01); *H01L 21/6875* (2013.01); *H01L 21/68735* (2013.01); *H01L 21/68771* (2013.01)

(56) References Cited

U.S. PATENT DOCUMENTS

| | | | |
|---|---|---|---|
| 2001/0003015 A1* | 6/2001 | Chang | C23C 16/0245 427/569 |
| 2001/0006849 A1* | 7/2001 | Suzuki | H01J 37/32302 438/710 |
| 2003/0010775 A1 | 1/2003 | Kim | |
| 2003/0051665 A1* | 3/2003 | Zhao | C23C 16/45565 118/723 E |
| 2003/0085205 A1* | 5/2003 | Lai | H01J 37/32431 219/121.43 |
| 2003/0089457 A1 | 5/2003 | Nallan et al. | |
| 2004/0011286 A1* | 1/2004 | Kwon | C23C 16/4405 118/715 |
| 2005/0022746 A1* | 2/2005 | Lampe | C23C 16/4581 118/728 |
| 2005/0223994 A1* | 10/2005 | Blomiley | C23C 14/505 118/725 |
| 2006/0191483 A1 | 8/2006 | Blomiley et al. | |
| 2007/0026620 A1* | 2/2007 | Yamada | B82Y 20/00 438/308 |
| 2007/0186853 A1 | 8/2007 | Gurary et al. | |
| 2007/0222131 A1 | 9/2007 | Fukumoto et al. | |
| 2008/0054153 A1 | 3/2008 | Soehnholz et al. | |
| 2008/0173735 A1* | 7/2008 | Mitrovic | C23C 16/45565 239/548 |
| 2008/0251020 A1* | 10/2008 | Franken | C23C 16/4584 118/730 |
| 2008/0308040 A1* | 12/2008 | Dauelsberg | C23C 16/45508 118/715 |
| 2010/0055318 A1* | 3/2010 | Volf | C23C 16/4583 427/255.28 |
| 2011/0049779 A1* | 3/2011 | Egami | C23C 16/4583 269/289 R |
| 2012/0204796 A1* | 8/2012 | Ruda Y Witt | C23C 16/458 118/725 |
| 2012/0309115 A1* | 12/2012 | Koelmel | H01L 21/6838 438/5 |
| 2014/0287142 A1* | 9/2014 | Boyd | C23C 16/46 427/255.28 |
| 2017/0037515 A1* | 2/2017 | Burrows | H05B 3/0047 |

FOREIGN PATENT DOCUMENTS

| | | | |
|---|---|---|---|
| JP | 01256118 A | 10/1989 | |
| JP | H0610140 A | 1/1994 | |
| JP | 2002146540 A | 5/2002 | |
| JP | 2005142529 A | 6/2005 | |
| KR | 100990746 B1 | 11/2010 | |
| WO | WO 03/048414 A1 * | 6/2003 | C23C 16/455 |
| WO | WO 2013/064613 A2 * | 5/2013 | C23C 16/46 |

OTHER PUBLICATIONS

International Search Report dated Sep. 30, 2013, by European Patent Office, for International Patent Application No. PCT/EP2012/071687 (filed Nov. 2, 2012), 9 pgs.

Written Opinion dated Sep. 30, 2013, by European Patent Office, for International Patent Application No. PCT/EP2012/071687 (filed Nov. 2, 2012), 23 pgs.

Preliminary Report dated May 6, 2014, by European Patent Office, for International Patent Application No. PCT/EP2012/071687 (filed Nov. 2, 2012), 25 pgs.

Advisory Action dated Mar. 15, 2018, for U.S. Appl. No. 14/356,104, filed May 2, 2014, 5 pages.

Response filed Mar. 5, 2018, for U.S. Appl. No. 14/356,104, filed May 2, 2014, 5 pages.

Final Office Action dated Jan. 3, 2018, for U.S. Appl. No. 14/356,104, filed May 2, 2014, 14 pages.

Amendment filed Nov. 29, 2017, for U.S. Appl. No. 14/356,104, filed May 2, 2014, 8 pages.

Non-Final Office Action dated Sep. 1, 2017, for U.S. Appl. No. 14/356,104, filed May 2, 2014, 13 pages.

Amendment filed Aug. 24, 2017, for U.S. Appl. No. 14/356,104, filed May 2, 2014, 8 pages.

Final Office Action dated May 5, 2017, for U.S. Appl. No. 14/356,104, filed May 2, 2014, 13 pages.

Amendment filed Dec. 19, 2016, for U.S. Appl. No. 14/356,104, filed May 2, 2014, 10 pages.

Non-Final Office Action dated Sep. 21, 2016, for U.S. Appl. No. 14/356,104, filed May 2, 2014, 13 pages.

* cited by examiner

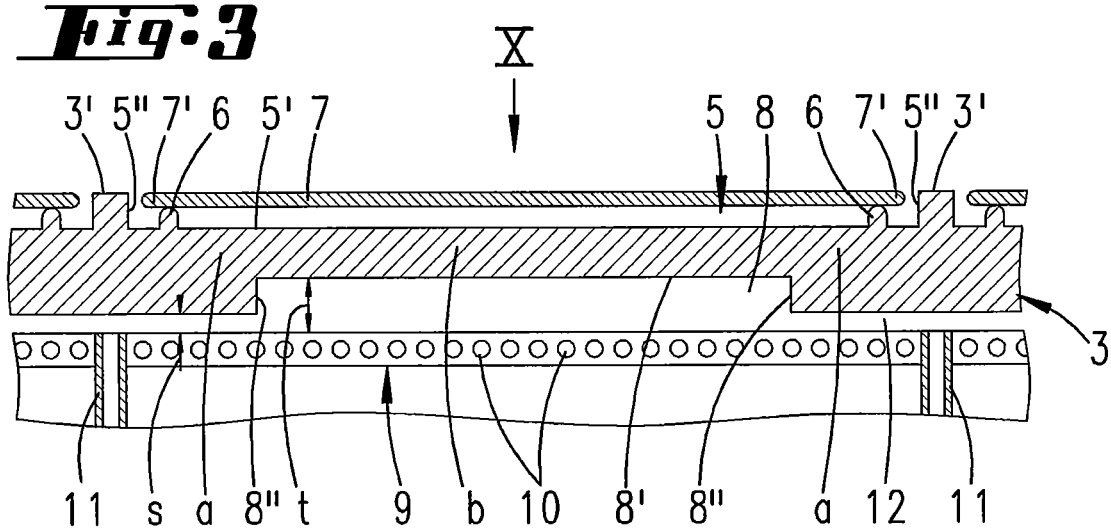
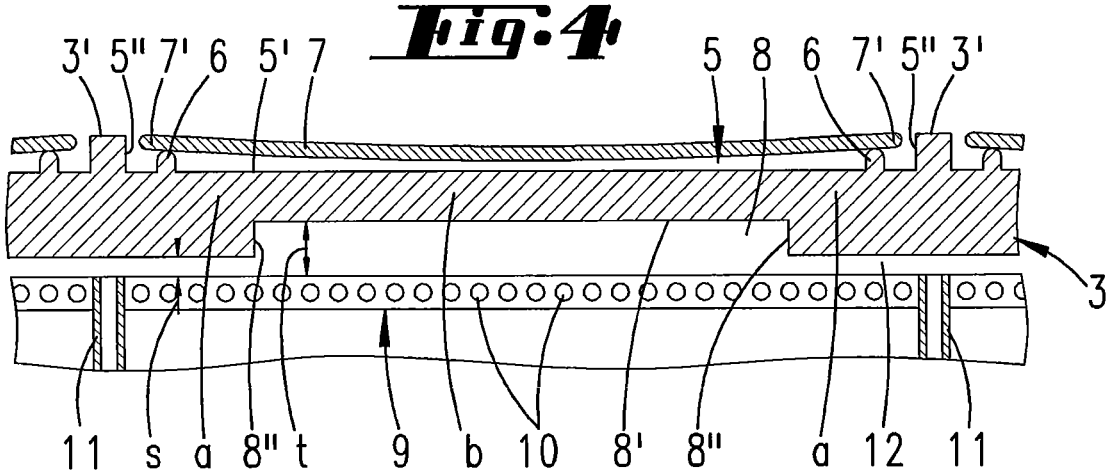
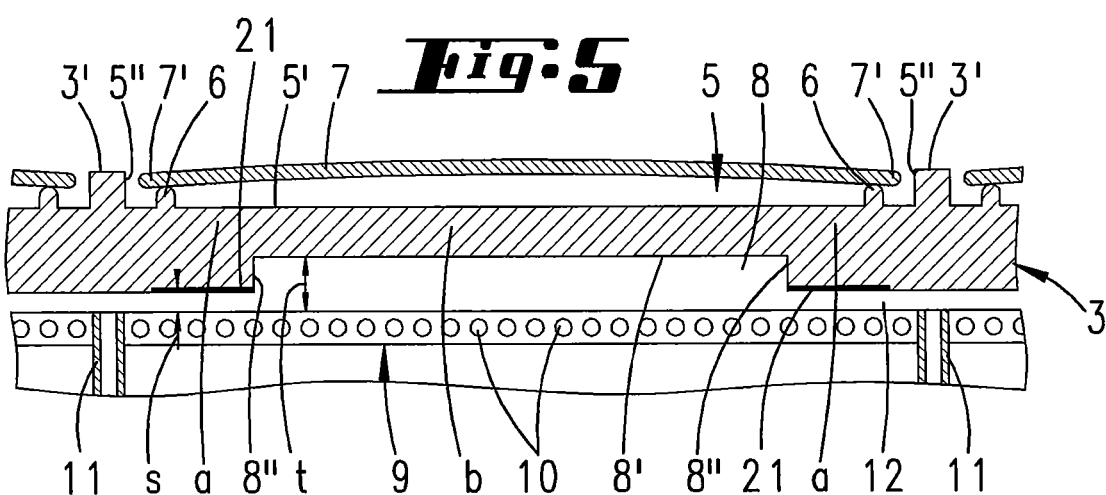

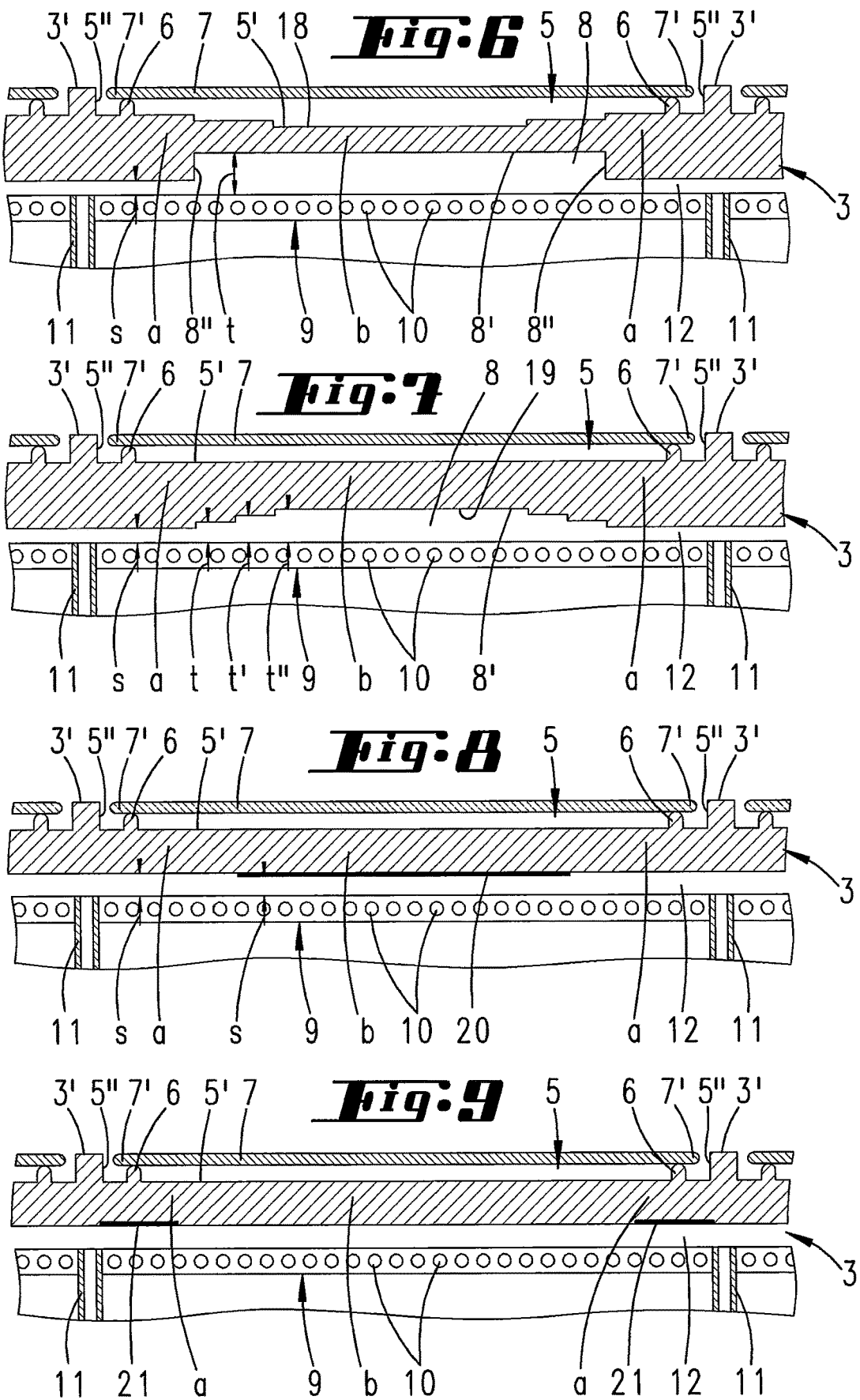

METHODS FOR CONTROLLING THE SUBSTRATE TEMPERATURE USING A PLURALITY OF FLUSHING GASES

RELATED APPLICATIONS

This application is a Divisional of U.S. application Ser. No. 14/356,104, filed 2 May 2014 (now abandoned), which is a NATIONAL STAGE under 35 USC 371 of and claims priority to International Application PCT/EP2012/071687, filed 2 Nov. 2012, incorporated herein by reference, which claims priority to DE 10 2011 055 061.5, filed 4 Nov. 2011.

FIELD OF THE INVENTION

The invention primarily relates to a CVD reactor having a reactor housing, a process chamber arranged therein, into which at least one process gas can be fed by means of a gas inlet body, having a substrate holder, which has, on its top side facing toward the process chamber, one or more pockets, which are formed so that respectively one substrate only rests on selected support regions, which are raised in relation to the base of the pocket, having a heater arranged underneath the substrate holder, which is spaced apart by a gap from the bottom side of the substrate holder, the bottom side of the substrate holder being designed differently in a central region, which lies under a middle zone of the pocket, in relation to the heat transfer from the heater to the substrate holder than in a surrounding region, which surrounds the central region and lies under an edge-proximal zone of the pocket.

BACKGROUND

Such a CVD reactor is described in JP 2002-146540 A. The substrate holder has a pocket formed by a depression, which has a further depression in its middle zone. The substrate rests on the edge step thus formed, which is raised in relation to the central zone of the base of the pocket. A heater, which is spaced apart from the bottom side of the substrate holder by a gap, is located underneath the substrate holder. The heater consists of multiple circumferential sections, which are spaced apart from one another by depressions. The bottom side of the substrate holder has a depression in a central region lying under a middle zone of the pocket, so that the gap height of the insulation gap is greater there than in a circumferential region surrounding this central region. A central heating element, using which the central region can be heated, lies underneath the central region. Spaced apart therefrom in the radial direction by a gap, a further heating element surrounding the first heating element is located, which can separately heat the surrounding region.

EP 0 160 220 B2 describes a substrate holder, in which the substrates also only rest on one edge of a pocket.

US 2011/0049779 A1 is concerned with the problem that substrates, which are coated in a CVD reactor with different layers at different temperatures, can curve as a result of different properties of the layers. For example, if a layer having a greater coefficient of thermal expansion than the substrate is deposited on the substrate in the coating process and the substrate is brought to a lower temperature or brought to a higher temperature in a following process step, the substrate curves in one direction or the other direction. Since the substrate is only supported on selected support regions and in particular only at the edge and otherwise extends freely over the base of the pocket, it is essentially heated by heat conduction via the gas between substrate and pocket base. In the case of a curve upward, the gas gap enlarges in the middle region, so that less heat is transported to the substrate there, with the consequence that the surface of the substrate has a lower temperature there than in the edge region. This has the consequence that the electrically— or optically—active layers deposited on the substrate have different properties from one another laterally. These inhomogeneities are very disadvantageous in particular in the manufacturing of light-emitting diodes and therein in the manufacturing of MQW (multi-quantum wall).

DE 10 2006 018 514 A1 describes a substrate holder, in which a rotationally-driven carrier, which can respectively carry one or multiple substrates, lies in each of a plurality of pockets. The substrates lie on the top side of the rotatable carrier. The rotatable carrier is mounted on a gas cushion. The gas forming the gas cushion can have various thermal conductivities. A recess is located in the bottom side of the carrier, so that the gas cushion between the base of the pocket and the bottom side of the carrier has zones of various gap heights. By variation of the thermal conductivity of the gas, the temperature profile on the top side of the carrier and therefore the substrate temperature can be locally influenced.

SUMMARY OF THE INVENTION

The invention is therefore based on the object of specifying measures, using which the homogeneity of multilayer structures, in particular made of elements of the III and V main groups, may be improved.

The object is achieved by the invention specified in the claims, wherein these are firstly and essentially based on the fact that the heater is implemented as an essentially flat heat source. The heater can be implemented in this case by a heating wire laid in a spiral. The spacing of the individual winding threads can be in the order of magnitude of the gap width. Such a flat heat source delivers a homogeneous heating power in the direction of the substrate holder over its entire area. The heat is transferred to the substrate holder both via heat radiation and also via heat conduction. A gas flushing unit is provided, to flush the gap with flushing gases of various thermal conductivities. If the gap is flushed with a flushing gas having a high thermal conductivity, for example, hydrogen, the heat conduction thus dominates during the heat transport. In contrast, if the gap is flushed with a flushing gas having lower thermal conductivity, the heat radiation thus dominates during the heat transport. According to the invention, the gap has a gap height such that in the event of a change from a first flushing gas having a first thermal conductivity to a second flushing gas having a second thermal conductivity, the heat supply from the heater to the substrate holder behaves differently in the circumferential region than in the central region. As a result of this design of the embodiment of the substrate holder, on the one hand, and its arrangement in relation to a flat, essentially homogeneous heat source, on the other hand, the heat flow inhomogeneities to the substrate caused by the curve can be compensated for. The compensation means is, according to the invention, a heat transfer inhomogeneity from the heater to the substrate holder, wherein locally different changes of the heat flow are induced by the change of the thermal conductivity of the flushing gas.

In a first variant, it is provided that the gap height of the gap under the central region is different from the gap height of the surrounding region. If the growth process is to be guided so that the base of the pocket has the same temperature both in the middle zone and also in the edge-proximal zone, a flushing gas having low thermal conductivity is used. The heat transport from the heater to the substrate holder is now dominated by the heat radiation, so that different gap heights only have a slight influence on the heat transport. In contrast, in the case of a process step in which the center of the substrate curves downward, if the reinforced heat transport due to the gap decreased therein between pocket base and substrate is to be compensated for, in that the middle zone of the pocket base obtains a somewhat lower temperature than the surrounding region, the gap between heater and substrate holder is thus flushed with a strongly heat-conductive flushing gas, so that the heat transport is now dominated by the heat conduction, which is less in the region of a high gap height than in the region of smaller gap heights. The power of the heater is readjusted accordingly. The bottom side of the substrate holder can have a depression in the central region. However, it is also possible that the bottom side of the substrate holder has a material accumulation pointing toward the heater in the central region, for example, a projection. The base of the pocket or the base of the recess or an end face of a material accumulation pointing toward the heater can be curved. This curve can be implemented as stepped. In a second variant, which is also combinable with the first variant, the bottom side of the substrate holder has a different reflectivity in the central region than in the surrounding region. For example, if the central region has a high reflectivity, in the case of a heat transport dominated by heat radiation, more heat is absorbed in the surrounding region than in the central region, since the degree of absorption is greater in the surrounding region than in the central region. It is also conceivable that the central region has a higher degree of absorption than the surrounding region. It then preferably has a higher degree of reflection than the central region. The zones of different reflectivity or different degrees of absorption can be implemented by a coating of the substrate holder bottom side. In the case of such a configuration, the base of the pocket obtains a substantially laterally homogeneous temperature distribution when the heat transport between heater and substrate holder is dominated by heat conduction, i.e., hydrogen is used as a flushing gas, for example. However, if the central zone of the base of the pocket is to obtain a lower temperature than the surrounding region underneath the substrate, a gas having a lower thermal conductivity, for example, nitrogen, is thus used as a flushing gas, so that now the heat transport is dominated by the heat radiation.

The substrate holder of the CVD reactor is additionally characterized in that the rib supporting the substrate runs along the edge of the essentially circular pocket. In this case, the rib can be spaced apart from the wall of the pocket. Furthermore, the CVD reactor is characterized in that projections oriented inward into the pocket originate from the edge of the pocket, to hold the substrate resting on the rib with equal edge spacing to the pocket wall over the entire circumference. Furthermore, the CVD reactor is characterized in that the rib respectively has an interruption in the region of the projections, which are preferably distributed uniformly around the circumference. In the region in which the substrate rests on the rib, the heat transport from the substrate holder to the substrate occurs via heat conduction via the direct material contact. In the region of the projections, an additional contact surface of the substrate holder is added to the substrate. However, a greater quantity of heat is at least locally transferred to the substrate there in relation to the remaining circumference due to the smaller spacing, so that local temperature increases can occur there. To compensate for this locally elevated heat flow to the substrate, the invention proposes as an independent refinement of the prior art, that the rib is interrupted in the regions of the projections. The circumferential length of the interruptions can approximately correspond to the circumferential length of the projections.

The substrate holder according to the invention can be manufactured from graphite. However, it is also provided that the substrate holder is manufactured from quartz, metal, or a crystalline material. The heat source is preferably a resistor through which current flows, in particular in the form of a heating wire.

The substrate holder embodied according to the invention can preferably have a circular shape and can be rotationally driven about its center axis. It has multiple circular pockets arranged around the center on its top side. One pocket can also lie in the center. The heater does not also have to rotate, because it is implemented so that it has an essentially homogeneous temperature distribution over its entire area. The CVD reactor is therefore additionally characterized in that the substrate holder is rotationally-drivable by means of a rotational drive in relation to the stationary heater associated with the reactor housing.

BRIEF DESCRIPTION OF THE DRAWINGS

Exemplary embodiments of the invention will be explained hereafter on the basis of the appended drawings. In the figures:

FIG. 3 shows an illustration according to FIG. 2, but enlarged in the region of a single pocket;

FIG. 4 shows an illustration according to FIG. 3 having downwardly curved substrate;

FIG. 5 shows a second exemplary embodiment according to FIG. 3 having upwardly curved substrate 7;

FIG. 6 shows a third exemplary embodiment of the invention in an illustration according to FIG. 3;

FIG. 7 shows a fourth exemplary embodiment according to FIG. 3;

FIG. 8 shows a fifth exemplary embodiment according to FIG. 3;

FIG. 9 shows a sixth exemplary embodiment according to FIG. 3; and

DETAILED DESCRIPTION OF THE INVENTION

Figure 2:
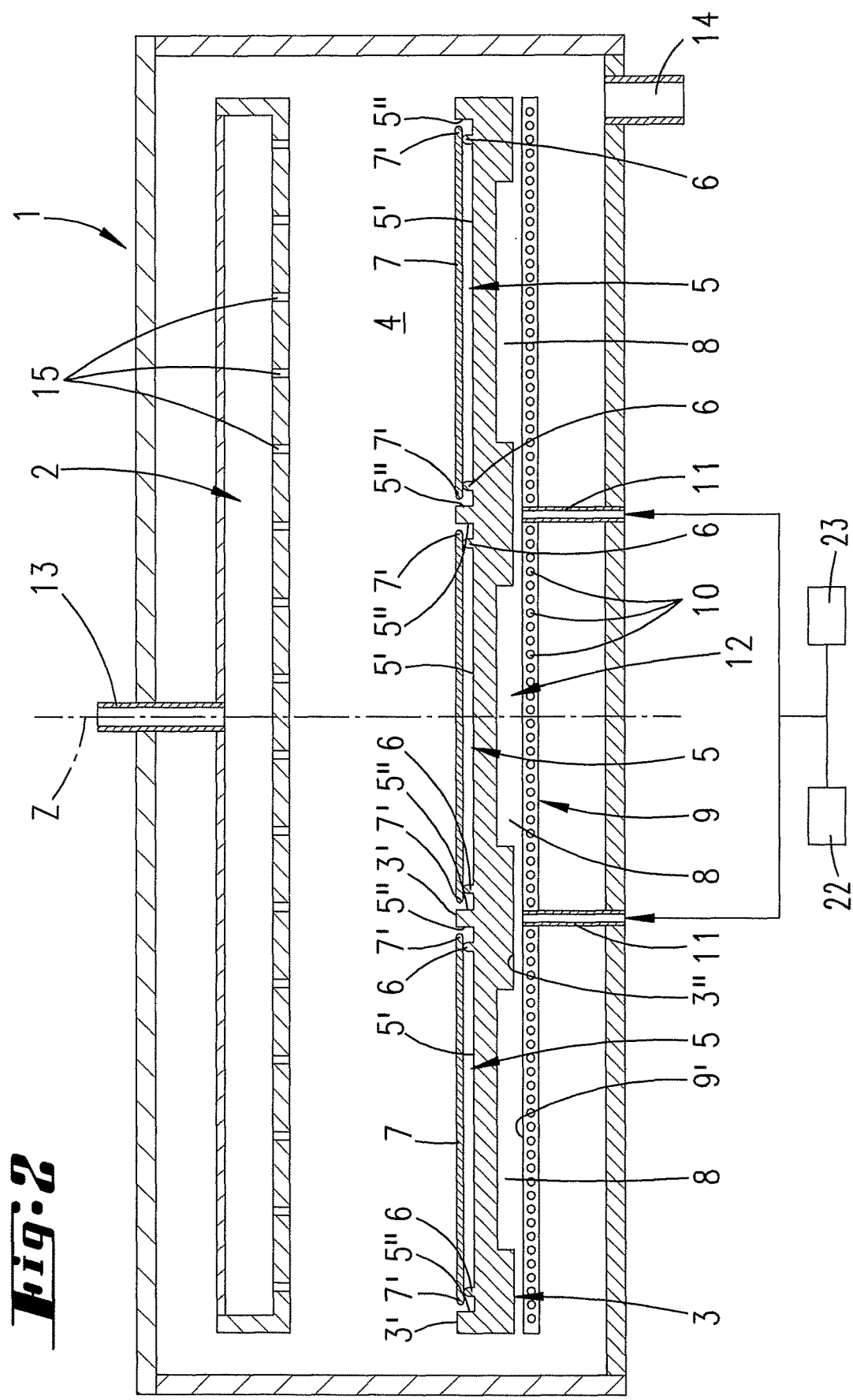
FIG. 2 shows a section along line II-II in FIG. 1.

FIG. 2 shows the cross section through a CVD reactor. It has an externally gas-tight housing 1. A feed line 13 leads into the housing 1. An exhaust line 14 leads back out of the housing. Suitable process gases, which contain, for example, trimethyl gallium, trimethyl indium, or trimethyl aluminum, can be introduced into a gas inlet body 2 through the feed line 13. The gas inlet body is only schematically shown. Not only starting materials which contain elements of the III main group, but rather also starting materials which contain elements of the V main group can be introduced into the gas inlet body 2. The introduction of the starting materials is respectively performed using a carrier gas, which can be hydrogen, for example. The gas inlet body 2 schematically shown in FIG. 2 is a showerhead. It has a plurality of gas outlet openings 15, through which the process gases can flow into a process chamber 4 arranged underneath. Various chambers, which are separate from one another, and which can each introduce a process gas, are located in the gas inlet body 2. Therefore, various process gases can be introduced into the process chamber 4 separately from one another.

In the exemplary embodiment (not shown), the gas inlet body 2 is designed differently, for example, as a central inlet body, so that the process chamber has vertical flow through it.

Figure 1:
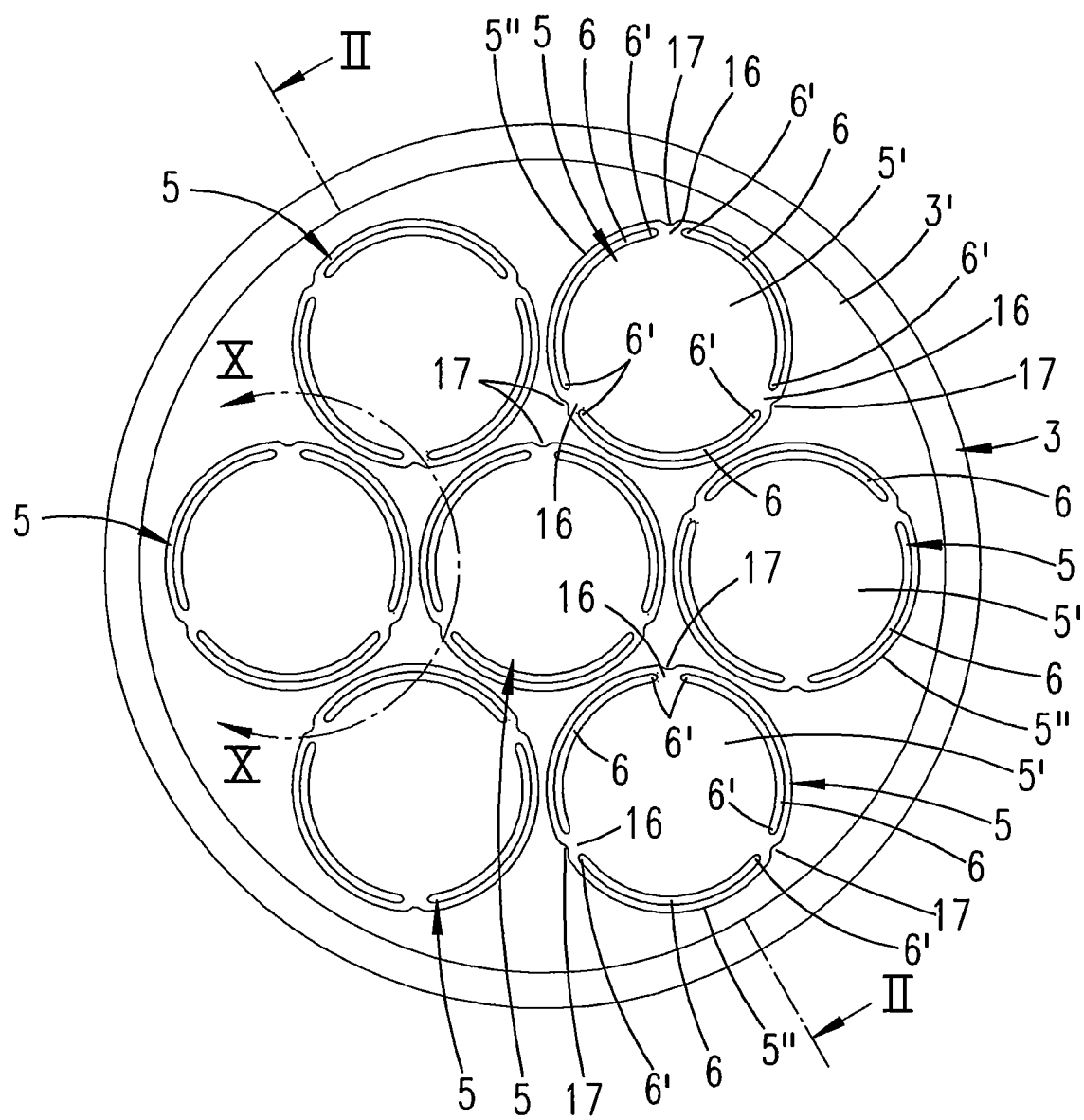
FIG. 1 shows a top view of a substrate holder 3 having a total of seven pockets 5, wherein six pockets are arranged uniformly around a central pocket 5.

The base of the process chamber 4 is formed by the top side 3' of a substrate holder made of graphite, for example. The substrate holder 3 has a circular formation, like the gas inlet body 2. A plurality of depressions 5 are incorporated in the top side 3' of the substrate holder 3. FIG. 1 shows the spatial arrangement of these depressions 5. The depressions 5 form circular pockets. A rib 6 respectively runs radially inward from the walls 5" of the pockets 5. This is a circular rib 6 in this case, on which the edge section of a substrate 7 can rest. The rib top sides are depressed somewhat in relation to the top side 3', so that the substrate surface runs flush with the top side 3'.

The base 5' of the pocket 5 is formed flat in the first exemplary embodiment shown in FIGS. 2 to 5, so that a gas gap forms between substrate bottom side and pocket base 5', which has the same gap height everywhere in the case of uncurved substrate.

The bottom side 3" of the substrate holder 3 has recesses 8. In the exemplary embodiment shown in FIGS. 2 to 4, the recesses 8 have flat recess bases 8', which run parallel to the pocket base 5'. The pockets 8 have pocket walls 8", which run on a circular arc line, wherein the circular arc line of the wall 8' of the recess 8 runs concentrically to the wall 5" of the pocket 5. The recess 8 only extends over a central region b which lies below a middle zone of the pocket base 5'. The central region b is enclosed by a surrounding region a, which extends under an edge region of the pocket 5.

A heater 9 extends underneath the substrate holder 3 parallel to the substrate holder 3. The heater 9 is shown in simplified form in the drawings. It is indicated that the heater 9 is formed by a heating wire 10 laid in a spiral. If a current flows through the heating wire 10, it heats up. The heating power which is emitted from this heating winding 10 is essentially constant over the entire area of the heater 9, so that the heater 9 emits an essentially homogeneous surface heating power. The heater 9 extends underneath the entire region of the substrate holder 3 occupied with pockets 5, specifically at a spacing of a few millimeters. In this way, a heat transfer gap 12 forms between the bottom side 3" of the substrate holder 3 and the top side 9' of the heater 9.

The gap width s of the gap 12 is of particular significance, which will be described in greater detail hereafter.

Flushing gas inlets, using which a flushing gas can be introduced from one or more of flushing gas sources 22 and 23 into the gap 12, are indicated with the reference sign 11. This flushing gas can be a pure gas, for example, hydrogen, nitrogen, argon, or helium. However, it can also be a mixture of these or other gases, in particular inert gases. The gap width s is selected so that at the process temperatures used, in the range between 500° C. and 1100° C., the heat transport from the heater 9 to the substrate holder 3 can only be changed by the selection of the flushing gas between heat-conduction-dominated and heat-radiation-dominated. If the heat transport is to be heat-conduction-dominated, a gas having a high thermal conductivity, for example, hydrogen, is thus introduced into the gap 12. If the heat transport is to be heat-radiation-dominated, in contrast, a gas having a lower thermal conductivity, for example, nitrogen, is thus introduced into the gap 12.

The depth of the recess 8, i.e., the distance of the base 8' from the bottom side 3", is selected so that less thermal power is transferred therein in the case of heat-conduction-dominated heat transport than in the surrounding region.

The heat transported from the heater 9 to the substrate holder 3 is dissipated from the substrate holder 3 via heat radiation or heat conduction through the process chamber 4 to the process chamber cover, which is cooled. In the exemplary embodiment, the showerhead 2 has cooling channels (not shown) for this purpose, through which a cooling medium flows, so that its bottom side facing toward the process chamber 4 is cooled.

In the second exemplary embodiment shown in FIG. 5, the edge section of the bottom side of the substrate holder 3 enclosing the recess 8 is coated using a reflective surface 21.

In the third exemplary embodiment shown in FIG. 6, the base 5' of the pocket 5 is depressed like a shell. The base 5' forms a stepped depression 18 there. The base 5' can alternatively thereto also have a stepped curve in particular, however.

In the fourth exemplary embodiment shown in FIG. 7, the base 8' of the recess 8 is formed like a bowl. It forms a stepped depression 19. In this way, the gap 12 has the gap height s, which is the least, in the region of the surrounding region a. In the central region b, i.e., in the region over which the recess 8 extends, the gap 12 has various gap heights t, t', t", which are each higher than the gap height s. An outward curve can also be provided instead of an inward curve here.

In the fifth exemplary embodiment shown in FIG. 8, the bottom side 3' of the substrate holder 3 has a high reflectivity in the region of the central region b. Therein it has a region 20 having a strongly reflective surface. In this case, this can be a coating, which strongly reflects infrared light, which is emitted from the heater 9. The surface section 20 in the region of the central region b at least reflects more strongly than the surface of the bottom side 3' in the surrounding region a. The radiation emitted by the heater 9 is more strongly absorbed therein than in the central region b.

While in all exemplary embodiments, the substrate holder 3 is essentially radiation-opaque to the heat radiation emitted by the heater 9, the substrate 7 can certainly be transmissive to heat radiation, i.e., it can consist of sapphire, for example. The heat transport from the base 5' of the pocket 5 to the substrate 7 therefore predominantly occurs via thermal conduction via the gas which is located between the bottom side of the substrate 7 and the base of the pocket 5.

In the sixth exemplary embodiment shown in FIG. 9, in contrast to the fifth exemplary embodiment shown in FIG. 8, the central region is not provided with a reflective surface 20, but rather the surrounding region a is provided with a strongly reflective surface 21, as also in the second exemplary embodiment shown in FIG. 5.

Figure 10:
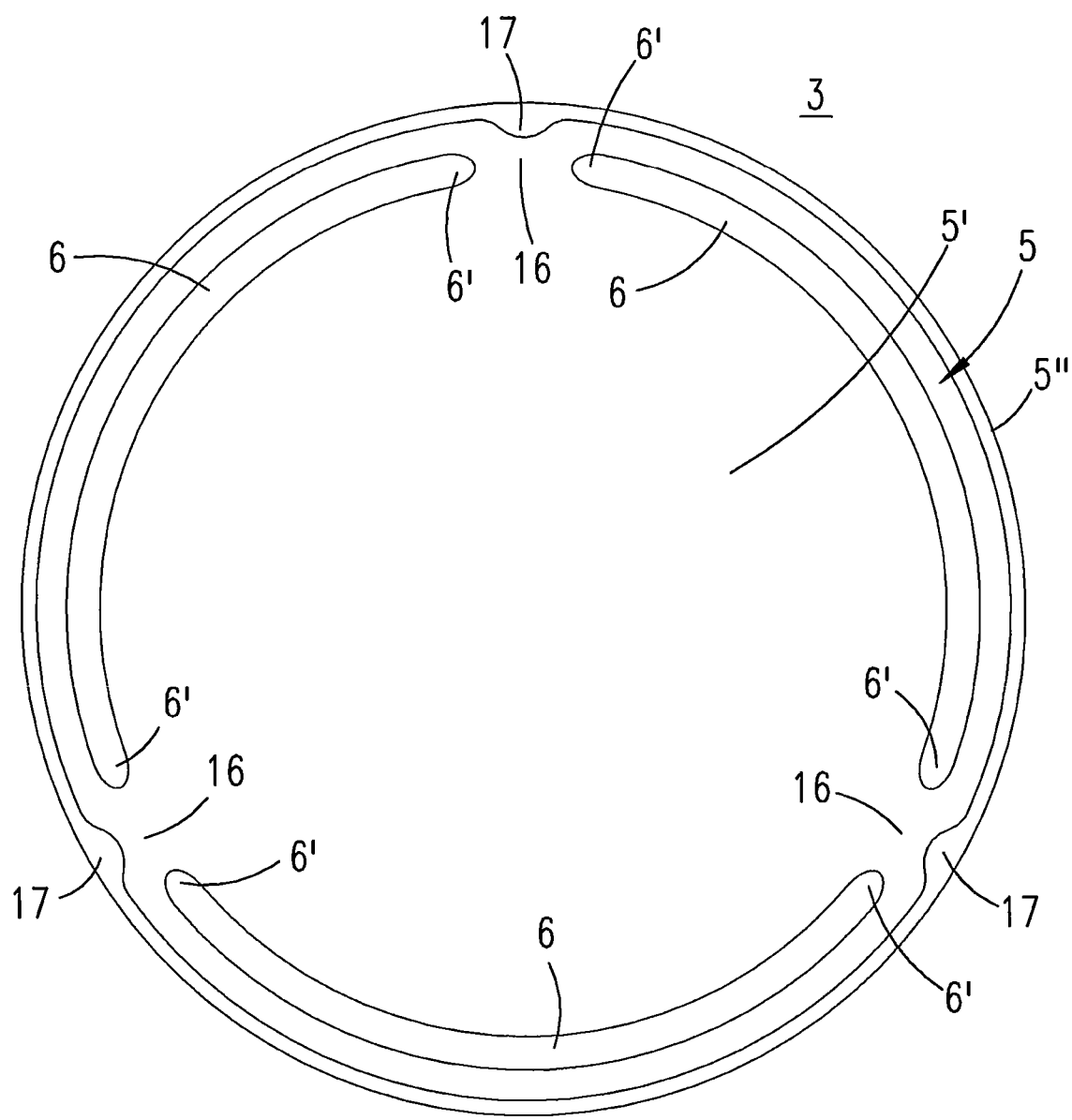
FIG. 10 shows a single pocket in a top view.

FIG. 10 shows the top view of a pocket 5, for example, of the first exemplary embodiment shown in FIGS. 2 to 5. The support region, on which the edge region of the substrate 7 rests, is formed by a circular rib 6, which leaves a clearance in the circle interior and which has a small spacing to the wall 5" of the pocket. The rib 6 is interrupted at multiple points, which are arranged distributed uniformly around the circumference of the rib 6. The rib 6 is therefore divided into multiple partial ribs, the ends 6' of which are spaced apart by a spacing clearance 16. The spacing clearance therefore forms an interruption of the rib 6.

In the region of these interruptions 16, projections 17 protrude radially inward from the edge 5" of the pocket 5. The extension of the projections 17 measured in the circumferential direction essentially corresponds to the extension of the interruptions 16 measured in the circumferential direction. Using the projections 17, the edge 7' of the substrate 7 is held in a gap spacing position to the edge 5" of the pocket 5.

The rib 6 is spaced apart from the wall 5" of the pocket 5 such that a channel forms between rib 6 and wall 5".

The mode of operation of the device is as follows: Using it, LED structures on a sapphire substrate may be turned off. In a first preparation step, the substrate surface is heated to a temperature of approximately 1100° C. A nucleation layer is deposited at a temperature which can be in the range between 500° C. and 1000° C. The gaseous starting materials, for example, a metal-organic compound of an element of the III main group and a hydride of an element of the V main group, are introduced in this case through the feed line 13 and the gas inlet body 2 into the process chamber 4. Gaseous reaction products and the carrier gas exit again from the gas exhaust line 14. During the deposition of the nucleation layer, the substrate 7 hardly sags, so that the spacing between substrate bottom side and base 5' is essentially equal everywhere in the exemplary embodiment shown in FIG. 3. During this process step, nitrogen is introduced through the flushing gas inlet 11 into the gap 12. The heat transport from the heater 9 to the substrate holder 3 therefore occurs via heat radiation, so that the surrounding region a and the central region b heat up to approximately the same temperature.

In a following process step, at a temperature which can be in the range between 1050° C. and 1100° C., firstly a buffer layer made of GaN is deposited. An n-doped GaN layer is then deposited on this layer. During this process, the substrate 7 sags toward the pocket base 5' as shown in FIG. 4. This has the consequence that a higher thermal power would be supplied to the substrate 7 in the central region b than in the surrounding region a, if the regions a, b had the same temperature. To keep the heat transport approximately equal in both zones, measures according to the invention are taken, to temporarily reduce the heat transport from the heater 9 to the substrate holder 3 in the central region b. For this purpose, a gas is introduced into the gap 12 through the flushing gas inlet 11, for example, hydrogen, which has a high thermal conductivity. As a consequence thereof, in the surrounding region a, where the gap height s is least, more heat is transferred per unit of time to the substrate holder 3 than in the central region b, where the gap height t is greater than the gap height s. As a consequence thereof, the pocket base 5' heats up in the central region b to a somewhat lower temperature than in the surrounding region a. From the substrate surface, the heat supplied from the bottom is dissipated by heat radiation or heat conduction to the process chamber cover, which is cooled.

A multi-quantum wall structure InGaN—GaN is then deposited on the n-doped buffer layer. This MQW structure is deposited at temperatures between 700° C. and 800° C. At this temperature, the substrate rests essentially flatly on the ribs 6, as shown in FIG. 3.

However, it can occur that the substrate 7 curves upward, as shown in FIG. 5. To perform a compensation here by way of local control of the heat flow, the central region b must be heated more highly than the surrounding region a. This may be achieved, for example, in that the heat supply in the surrounding region a is reduced in the radiation-dominated heat transport region, which can be implemented, for example, by a reflective surface 21. For example, the substrate holder bottom side 3" can be covered therein with a reflective layer 21. By balancing out the mixing ratio of two gases having coefficients of heat conduction which strongly deviate from one another, the states shown in FIGS. 3 and 4 can then also be reached, in which surrounding region a and central region b are heated equally strongly or the surrounding region a is heated more strongly than the central region b.

In a last step, a p-contact layer, which consists of p-doped AlGaN, is deposited on the MQW structure. This is performed at process temperatures between 800° C. and 950° C. The slight sag of the substrate 7 forming in this case toward the pocket base 5' can be considered in the manner described above with reference to FIG. 4.

All process steps can be carried out with permanently rotating substrate holder 3. For this purpose, the substrate holder 3 is rotationally driven using drive means (not shown) about its central axis Z. The substrate holder 3 then rotates in relation to the heater 9, which is held stationary, at uniform spacing 12.

In the exemplary embodiments shown in FIGS. 8 and 9, the surrounding region a and the central region b heat up in the heat-conduction-dominated regime, i.e., uniformly with the use of a strongly heat-conductive flushing gas. A local temperature inhomogeneity in the region of the pocket base 5' results here in the radiation-dominated regime, if nitrogen or another flushing gas having low thermal conductivity is used as the flushing gas. Then, in the fourth exemplary embodiment shown in FIG. 8, the surrounding region a heats up more strongly than the central region b or, in the fifth exemplary embodiment shown in FIG. 9, the central region b heats up more strongly than the surrounding region a.

The substrate 7 resting on the support region 6 is heated more strongly in the region of the support surface, i.e., in the edge region, since it is in contact with the rib 6 here. A heat supply flow also occurs from the pocket edge 5" toward the substrate holder edge 7'. This heat transport is increased in the region of the projections 17, since the gap between projection 17 and substrate holder edge 7' is smaller here than the gap between pocket edge 5" and substrate holder edge 7'. To compensate for this locally increased heat supply, the above-described interruptions 16 are provided in the rib 6, which extend essentially over the same length over which the projections 17 extend.

All disclosed features are essential to the invention (per se). The contents of the disclosure of the associated/appended priority documents (prior application) are hereby also incorporated in their entirety in the contents of the disclosure of the application, also for the purpose of incorporating features of these documents in the claims of the present application. The dependent claims characterize, in their optional, subordinate version, independent refinements according to the invention of the prior art, in particular to perform divisional applications on the basis of these claims.

LIST OF REFERENCE SIGNS 1 reactor housing
2 gas inlet body
3 substrate holder
3' substrate holder top side
3" substrate holder bottom side
4 process chamber
5 pocket
5' pocket base
5" pocket edge 6 support region, rib
6' ends
7 substrate
7' substrate holder edge
8 recess
8' base
8" pocket walls
9 heater
10 heater winding
11 flushing gas inlet
12 gap
13 gas feed line
14 gas exhaust line
15 gas outlet opening
16 interruption
17 projection
18 depression, shell-like
19 depression
20 reflective surface
21 reflective surface
22 flushing gas source
23 flushing gas source
a surrounding region
b central region
s gap height
t gap height

What is claimed is:

1. A method for depositing a plurality of layers arranged one on top of another in respectively one process step on a substrate (7) in a CVD reactor having (i) a reactor housing (1), (ii) a process chamber (4) arranged therein, into which at least one process gas can be fed by means of a gas inlet body (2), (iii) a substrate holder (3), which has, on its top side (3') facing toward the process chamber (4), one or more pockets (5), which are formed so that respectively one substrate (7) only rests on selected support regions (6) raised in relation to a base (5') of the one or more pockets (5), and (iv) a heater (9) arranged underneath the substrate holder (3), which is spaced apart by a gap (12) from a bottom side (3") of the substrate holder (3), wherein the bottom side (3") of the substrate holder (3) has a depression (8) in a central region (b) lying under a middle zone of the one or more pockets (5) or has a different reflectivity than in a surrounding region (a), which surrounds the central region (b) and lies underneath an edge-proximal zone of the one or more pockets (5), so that heat transfer from the heater (9) to the substrate holder (3) is different in the central region (b) than in the surrounding region (a), wherein the heater (9) is implemented as an essentially flat heat source, which extends underneath an entire region of the substrate holder (3) occupied with the one or more pockets (5), the method comprising:

flushing, by a gas flushing unit (11), the gap (12) with flushing gases of various thermal conductivities, wherein flushing the gap with flushing gases of various thermal conductivities comprises changing from a first flushing gas having a first thermal conductivity to a second flushing gas having a second thermal conductivity, wherein the gap (12) has a gap height (s, t) such that when changing from the first flushing gas having the first thermal conductivity to the second flushing gas having the second thermal conductivity, the heat transfer from the heater (9) to the substrate holder (3) through the gap changes differently in the surrounding region (a) than in the central region (b), and wherein, in at least one first process step, a first layer having a first composition is deposited at a first temperature and, in at least one second process step, a second layer having a second composition is deposited at a second temperature, wherein the first and second compositions and the first and second temperatures are different from one another.

2. The method of claim 1, wherein, in the first process step, the heat transfer from the heater (9) to the substrate holder (3) is heat-radiation-dominated and, in the second step, the heat transfer is heat-conduction-dominated at least in one of the surrounding region (a) and the central region (b).

3. The method of claim 1, wherein, in the first process step, a first mean temperature in a middle zone of the base (5') of the one or more pockets (5) corresponds to a second mean temperature of an edge region of the base (5') and, in the second process step, the first and second mean temperatures are different from one another.

* * * * *